US005651016A

United States Patent [19]
Yu et al.

[11] Patent Number: 5,651,016
[45] Date of Patent: Jul. 22, 1997

[54] ULTRAHIGH SPEED LASER

[75] Inventors: Rang-Chen Yu, San Jose; Stephen Robert Whiteley, Sunnyvale; Barry Hugh Whalen, Los Altos, all of Calif.

[73] Assignee: Conductus, Inc., Sunnyvale, Calif.

[21] Appl. No.: 657,638

[22] Filed: May 30, 1996

Related U.S. Application Data

[63] Continuation of Ser. No. 241,055, May 11, 1994, abandoned.

[51] Int. Cl.$^6$ .................................................. H01S 3/04
[52] U.S. Cl. ........................ 372/34; 372/26; 372/6; 372/82
[58] Field of Search ........................ 372/26, 38, 34, 372/71, 28, 6, 29, 82

[56] References Cited

U.S. PATENT DOCUMENTS

| | | | |
|---|---|---|---|
| 4,485,474 | 11/1984 | Osterwalder | 372/28 |
| 4,910,737 | 3/1990 | Payne et al. | 372/6 |
| 5,008,890 | 4/1991 | McFarlane | 372/71 |
| 5,136,600 | 8/1992 | Fidric et al. | 372/6 |

OTHER PUBLICATIONS

"Direct modulation of semiconductor lasers at f>10 GHz by low temperature operation" K.Y. Lau, et al. (unpublished preprint, submitted to *Appl. Phys. Lett.* Sep. 1983).

"Temperature dependence of long wavelength semiconductor lasers," J. O'Gourman et al., *Appl. Phys. Lett.* 60, 1058–1060 (Mar. 1992).

"Temperature characteristics of $(InAs)_1/(GaAs)_4$ short-period lattices quantum well laser," N.K. Dutta, et al., *Appl. Phys. Lett.* 62, 2018–2020 (Apr. 1993).

"Microampere threshold current operation of GaAs and strained InGaAs quantum well lasers at low temperatures (5 K)" L.E. Eng, et al., *Appl. Phys. Lett.* 58, 2752–2754 (Jun. 1991).

"25 GHz bandwidth 1.55 µM GaInAsP p—Doped Strained Multiquantum–Well Lasers", P.A. Morton et al., *Electronics Letters* 28, 2456–2457 (Nov. 1992).

"High-speed InGaAs/GaAs strained multiple quantum well lasers with low damping," Nagarajan et al., *Appl. Phys. Lett.* 58, 2326–2328 (May 1991).

*Primary Examiner*—Leon Scott, Jr.
*Attorney, Agent, or Firm*—Judith A. DeFranco, Esq.

[57] ABSTRACT

An apparatus and method for obtaining ultra-high speed operation of a semiconductor laser diode is presented. The invention utilizes any of a variety of conventional laser diodes in combination with cooling means for operation of the laser at temperatures below 120 K. Input electrical signals may include signals on a 28 GHz signal carrier and pulsed signals. An extended fiber optics cable may be used to operate the system as an optical delay line.

15 Claims, 11 Drawing Sheets

ULTRAHIGH SPEED LASER

CROSS REFERENCE TO RELATED APPLICATIONS

This application is a continuation of U.S. patent application Ser. No. 08/241,055, filed 11 May 1994 now abandoned.

STATEMENT OF GOVERNMENT INTEREST

The U.S. Government has a paid-up license on this invention and the right in limited circumstances to require the patent owner to license others on reasonable terms as provided for by the terms of contract No. 70NANB2H1238 awarded by the Department of Commerce.

BACKGROUND OF THE INVENTION

1. Field of the Invention

This invention relates to the field of laser diodes having ultrahigh speed performance. More particularly, it relates to laser diodes cryogenically cooled to temperatures that provide increased modulation bandwidth.

2. Description of Related Art

Semiconductor laser diodes find use in numerous commercial applications, including optical fiber communication and data transmission. Typically, the laser diodes are operated at or near room temperature, although in certain applications, such as in space applications, the laser diodes may be exposed to cryogenic temperatures. For certain advanced applications, an ultrahigh speed laser diode, characterized by ultrahigh modulation bandwidth, having a high modulation depth with minimal signal distortion, is very desirable. Typical commercial laser diodes operated at room temperature have modulation bandwidths of less than a few GHz. The fastest commercially available high speed laser diodes have modulation bandwidths of about 12 GHz. Ultrahigh speed laser diodes with modulation bandwidths significantly exceeding 12 GHz will be an essential component for ultrahigh speed data transmission optical fiber links to meet the ever increasing demand for much higher data traffic in the national information infrastructure (also known as "Information Superhighway"). This invention provides an ultrahigh speed laser diode.

According to the invention, ultrahigh speed performance is achieved by cooling a laser diode to a range of low temperatures significantly beyond the common practice, and by selecting appropriate laser diode bias currents. By cooling the laser diode, the threshold current is also decreased, while the cooling also facilitates the use of higher bias currents by preventing the heating associated with the use of high bias currents in room temperature lasers.

A few workers have studied the effect of temperature on laser threshold current. They include J. O'Gorman et al., "Temperature dependence of long wavelength semiconductor lasers," Appl. Phys. Lett. 60 1058–1060 (1992); N. K Dutta, et al. "Temperature characteristics of $(InAs)_1/(GaAs)_4$ short-period lattices quantum well laser," Appl. Phys. Lett. 62 2018–2020 (1993); and L. E. Eng, et al., "Microampere threshold current operation of GaAs and strained InGaAs quantum well lasers at low temperatures (5 K)," Appl. Phys. Lett. 58 2752–2754 (1991). O'Gorman, Dutta and Eng did not report the effect of temperature on the modulation bandwidth of the lasers in their studies.

While little attention has been focused on the effect of cryogenic cooling on laser performance, much has been directed to improvement of their speed performance. Laser diodes operating at ultrahigh speeds, particularly those operating at 28 GHz or higher, offer opportunities for a number of applications not possible with slower laser diodes. Examples include satellite antenna remoting in the Ka or millimeter wave band, optical fiber delay lines for millimeter wave coherent applications, and long distance millimeter wave signal carrier transmission on optical fibers. For interface with the proposed 27–29 GHz commercial broadcast band, modulation bandwidths of at least 28 GHz would greatly simplify system design.

The highest modulation bandwidth for a semiconductor laser diode at communication wavelengths was reported by researchers at AT&T Bell Laboratories. P. A. Morton et al. "25 GHz bandwidth 1.55 µM GaInAsP p-Doped Strained Multiquantum-Well Lasers," Electronics Letters 28 2456–2457 (1992) achieved a 25 GHz bandwidth in a multiquantum-well laser operated with a bias current of 180 mA. At a bias current of 40 mA, the modulation bandwidth was approximately 15 GHz. This high modulation bandwidth was achieved at the price of providing a very high bias current to the laser diode. A large bias current would not only be likely to result in unacceptably high signal distortion due to nonlinear light current characteristics, but would also generate excess heat resulting in premature failure of the laser diode.

SUMMARY OF THE INVENTION

This application discloses an ultrahigh speed semiconductor laser diode useful for high speed optical data transmission, optical pulse generation, communication between cryogenic electronics and room temperature electronics, optical fiber delay lines, and other applications where high speed transmission is desired. A semiconductor laser diode is cooled to increase its modulation bandwidth. The temperature at which the maximum modulation bandwidth is obtained is bias current dependent. For the laser diodes tested, a maximum modulation bandwidth was obtained at 80–100 K, with rapid decreases below 40 K and above 120 K A nearly four-fold improvement in modulation bandwidth (from approximately 7 GHz to 27 GHz at 3 dB for an 40 mA bias current) was demonstrated. The invention also provides an apparatus for obtaining an ultrahigh bandwidth optical signal, and systems for optical pulse generation, for data transmission and microwave delay lines having an ultrahigh speed laser diode as a component.

DETAILED DESCRIPTION

It is an object of the invention to provide a laser diode assembly having an ultrahigh modulation bandwidth at moderate bias currents. An ultrahigh bandwidth as used herein is a modulation bandwidth of greater than 15 GHz, and preferably greater than 25 GHz.

It is a further object of the invention to provide a method of increasing the modulation bandwidth of a laser diode.

It is a further object of the invention to provide a method of increasing modulation depth with a modest bias current.

It is a further object of the invention to provide a laser diode assembly for direct interface with millimeter microwave radio transmitters operating in the 28 GHz carrier range.

It is a further object of the invention to provide a laser diode for ultra broad band applications from DC up to 28 GHz.

It is a further object of the invention to provide an optical short pulse generator suitable for operation in gain switching mode or direct modulation mode.

It is a further object of the invention to provide an ultrahigh speed transmitter for an optical fiber interconnect to cryogenically operated electronics.

It is a further object of the invention to provide a transmitter for an optical fiber delay line for millimeter wave applications.

It is a further object of the invention to provide a transmitter for an optical fiber link for satellite antenna remoting near or at mm wave band.

These and other objectives are achieved by providing a laser diode assembly comprising, in combination, a semiconductor laser diode; a cooler for cooling the semiconductor laser diode to a temperature selected to optimize the modulation bandwidth of the laser diode, generally below −50C. (223 K) and typically about 40–120 K, more typically 80–100 K; a bias current input to the laser diode and an electrical signal input to the laser diode.

The modulation speed of many different semiconductor laser diodes, including bulk, quantum well, and strained multiple quantum well, Fabry-Perot or distributed feedback laser diodes, may be greatly enhanced by practice of the invention. Depending upon the laser used, modulation bandwidths of 40 GHz or greater are achievable by practice of the invention. For ultrahigh speed long distance communication and data transmission applications, the laser diode should have a lasing wavelength matched to the zero dispersion point of the optical fiber. e.g. 1300 nm for silica single mode fiber or 1550 nm for dispersion shifted fiber. The lasing wavelength of the laser diodes usually decreases with decreasing temperature. Therefore, the preferred diode will have a lasing wavelength at room temperature that is longer than the desired operating wavelength.

The cooler may be any device capable of cooling the laser diode to the desired temperature, typically to about 60–120 K, more typically 80–100 K The diode package may be mounted on a cold-plate of a cryogenic cooler. A temperature sensing device, such as a diode thermometer, and a heater may also be mounted to the cold-plate to regulate the laser diode temperature within the desired temperature range. Examples of coolers are closed-cycle refrigerators or cryogenic dewars with a liquid cryogen.

Any conventional means of delivering the bias current and the modulation current to the laser diode may be used. One method is through a low loss, high speed, coaxial cable. Alternatively, the electronics providing the signal to the laser, e.g. a driver circuit, may be integrated with the laser within the cryogenic space. If the electrical signal is delivered through a cable from a room temperature source, it is desirable cool the cable to the cryogenic temperatures before contacting it to the laser to minimize thermal leakage by the cable. This may be accomplished by connecting the input cable through a high heat capacity, thermally conducting block maintained at or near the desired temperature.

The optical output signal from the laser may be obtained by any conventional means, including coupling to an optical fiber or through free space optical techniques. Such techniques are known in the art.

In practicing the invention, it is not necessary that the temperature and bias current be selected to obtain the maximum speed of the laser. Rather, the invention teaches, for the first time, that significant, that is greater than two-fold, and as much as four-fold, increases in the modulation bandwidth are obtained by cooling the laser diode within a narrow temperature range. The temperature range may differ with different types of lasers, and also differs with the applied bias current. Cooling of the laser to achieve a speed less than the maximum possible is within the scope of the invention, where such cooling increases the speed of the laser.

EXAMPLES

Example 1. Laser Diode Test Assembly.

Figure 1:
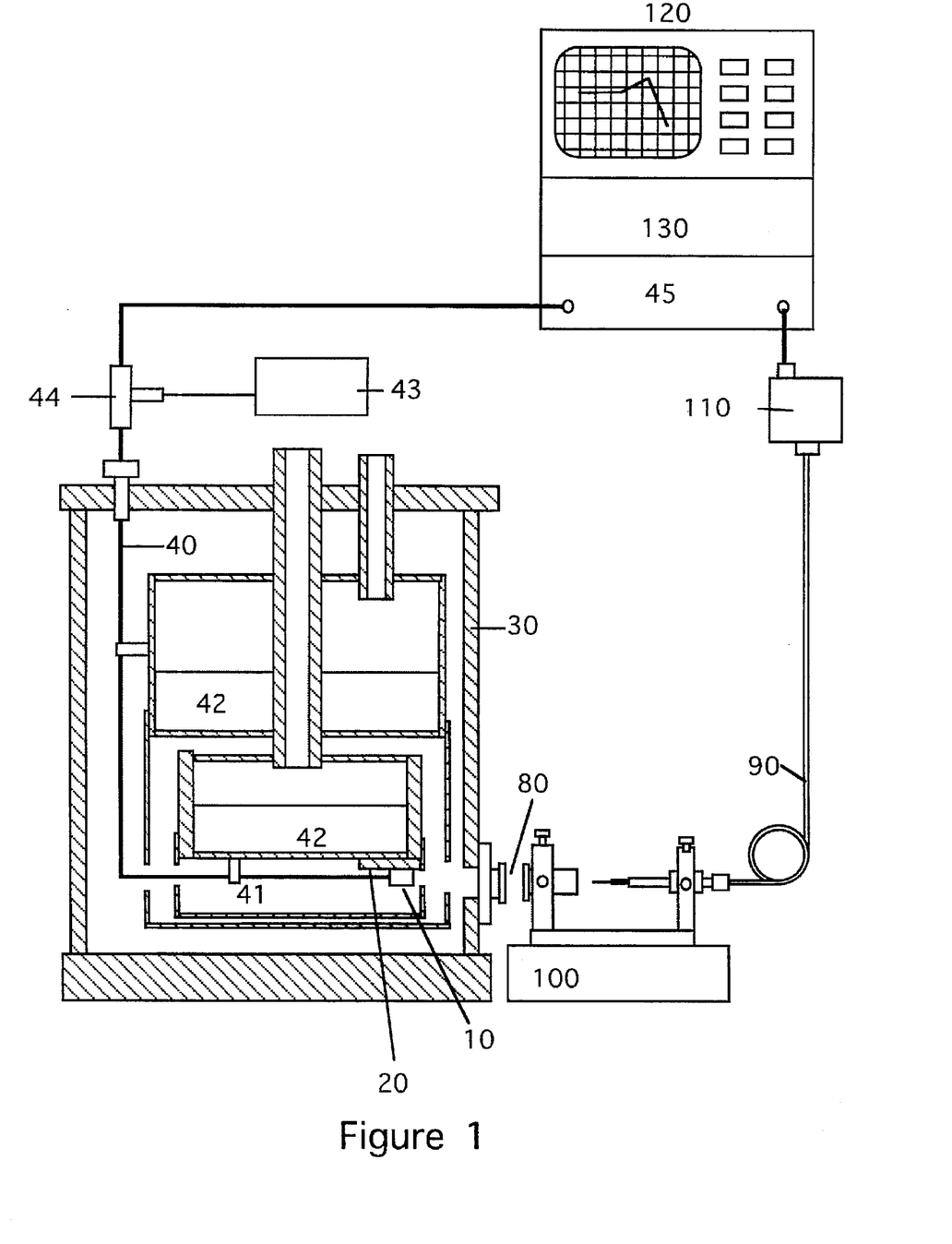
FIG. 1 depicts the test apparatus used to determine the modulation bandwidth of cryogenically cooled laser diodes.
Figure 2:
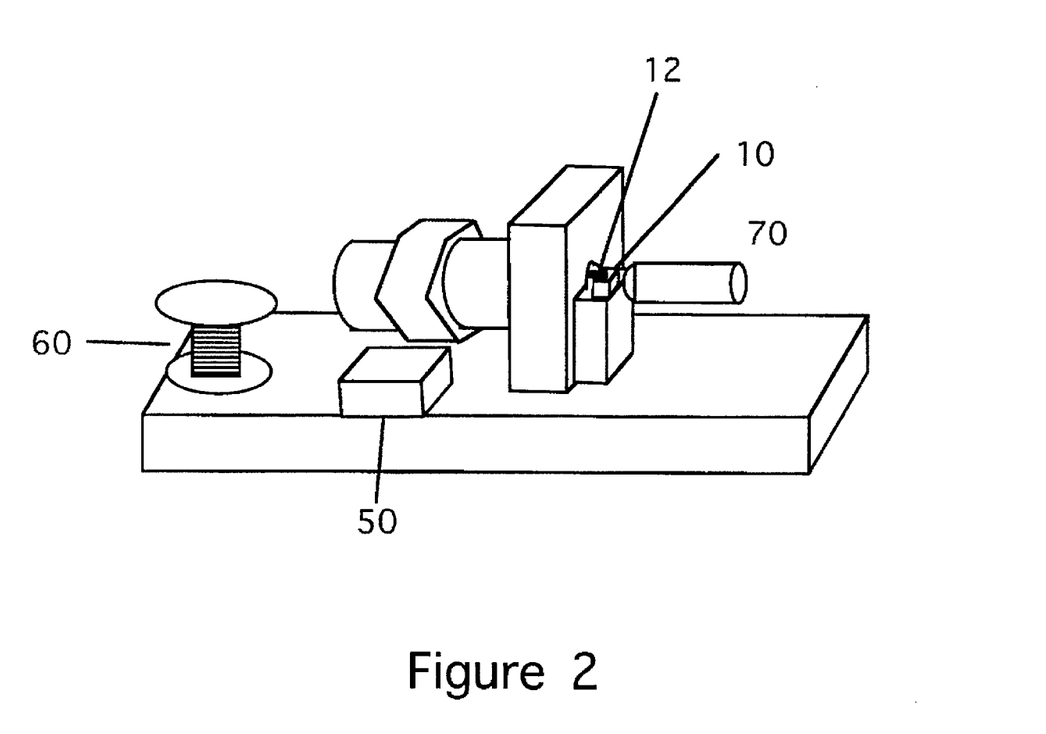
FIG. 2 is an enlarged view of the high speed laser diode package.

A four-quantum-well strained layer (0.4% strain) laser with InGaAsP p-doped active region designed to operate at 1.55 µm was processed into a polyimide buried ridge waveguide structure having a low parasitic capacitance and capable of large modulation bandwidth in the InGaAs/GaAs system. The waveguide structure was previously described in R. Nagarajan, T. Fukushima, S. W. Corzine, and J. E. Bowen, Appl. Phys. Lett., 58, 2326 (1991), which is incorporated herein by reference. The laser cavity length was 300 mm and the ridge width was 1.0 mm. FIG. 1 depicts the test apparatus used to determine the modulation bandwidth of cryogenically cooled laser diodes. FIG. 2 is an enlarged view of the high speed laser diode package. The laser diode chip [10] was mounted in a high speed package with a 0.2 mm long 50 mm wide gold ribbon bonded between the K-connector launch center pin [12] and the laser diode p-side contact pad. The laser diode package was mounted on the cold-plate [20] of a two-stage cryogenic dewar [30] that can be used with both liquid nitrogen and helium cryogens. A 40 GHz semirigid coaxial cable [40] was connected through a thermally conducting block [41] attached to the thermal bath [42] and connected to the laser diode chip [10]. DC bias current was supplied by a power supply [43] through a bias T [44], where it was combined with a high frequency microwave signal from a testset [45]. A thermometer diode [50] and heater [60] were also mounted on the cold plate [20] near the laser diode chip [10] for temperature control. A graded reflective index (GRIN) rod lens [70] was mounted in front of the laser for collimating the light output from the laser. The collimated laser output was transmitted through an anti-reflection coated optical window on the side of the dewar [80] coupled to a single mode fiber [90] by a fiber coupler [100] then sent to a 45 GHz photodetector [110]. The high frequency response of the link was measured with a vector network analyzer, [120] synthesized sweeper [130] and testset. [140] The calibration of the semirigid cables was performed at room temperature.

Example 2. Temperature Dependence of Threshold Current

Figure 3:
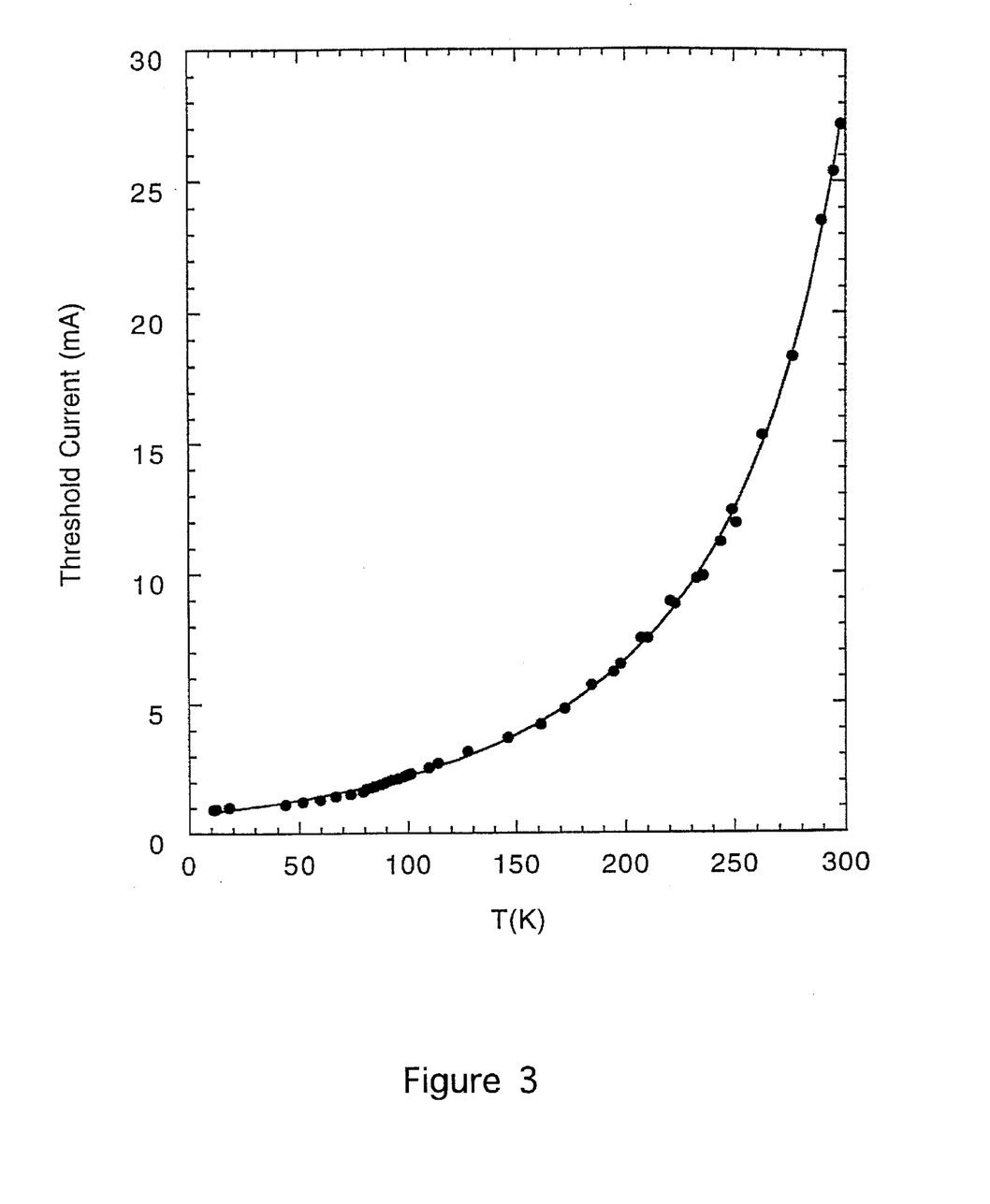
FIG. 3 shows the threshold current as a function of temperature for one laser diode.

Using the test apparatus of Example 1, we determined the temperature dependence of the threshold current of the laser diode from 10 K to 300 K FIG. 3 shows the threshold current as a function of temperature. The threshold current decreased with temperature from about 27 mA at 300 K to about 0.9 mA at 10 K An empirical double exponential formula $I_{th}=I_1\exp(T/T_1)+I_2\exp(T/T_2)$ fits the data quite well over the temperature range with $I_1=0.89$ mA, $I_2=0.0018$ mA, $T_1=106$ K, and $T_2=34$ K respectively. It can thus be seen that by cooling the laser diode to 80 K better thermal stability was obtained, with $\Delta I_{th}/\Delta T=0.03$ mA/K compared with 0.4 mA/K at 290 K.

Figure 4:
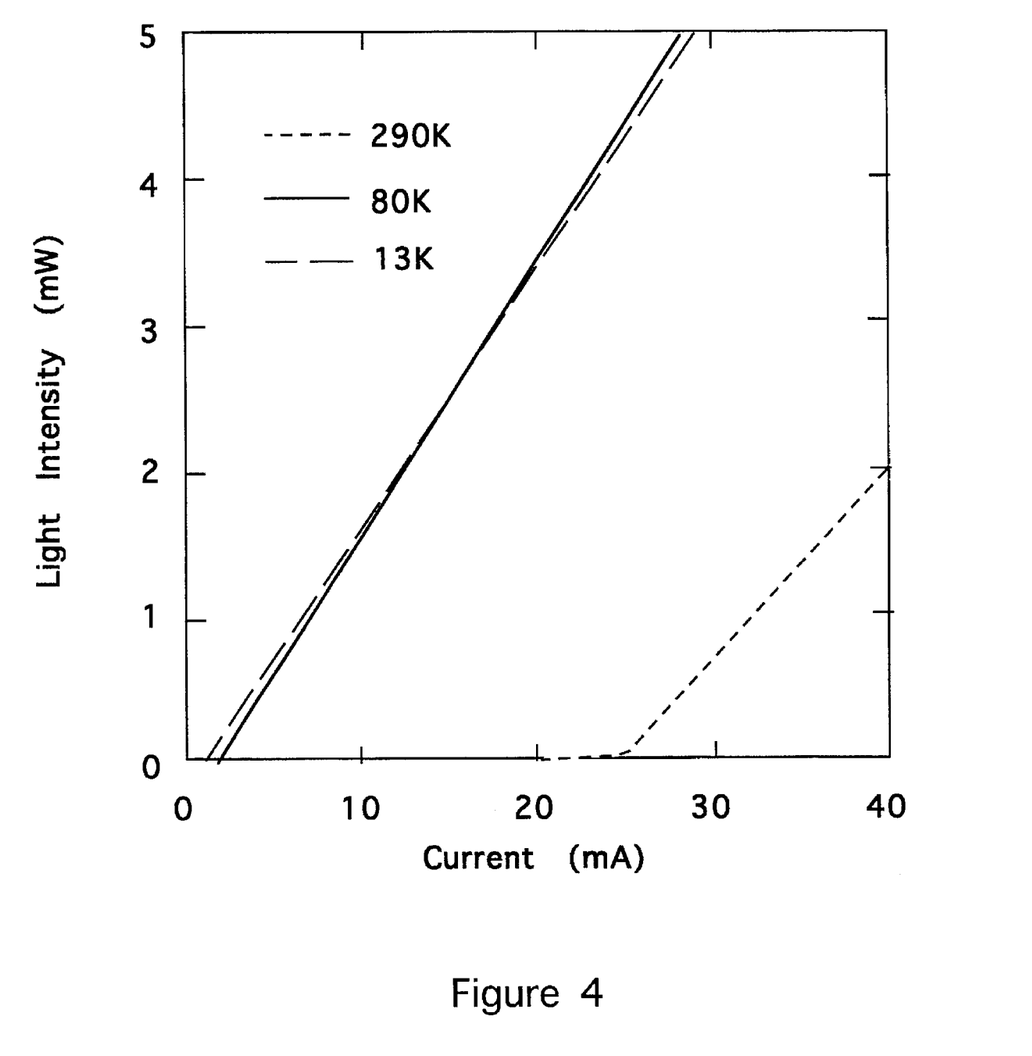
FIG. 4 shows the relationship between the bias current in mA and the relative output light intensity at three temperatures: 290 K, 80 K and 13 K at bias currents of 0 to 40 mA.

FIG. 4 shows the relationship between the bias current in mA and the relative output light intensity at three temperatures: 290 K, 80 K and 13 K at bias currents of 0 to 40 mA. At all temperatures tested, the light output response was linear above the threshold current. FIG. 4 also demonstrates that the quantum efficiency of the laser diode is improved by cooling to 80 K $\Delta L/\Delta I=0.19$ mW/mA at 80 K vs. 0.13 mQ/mA at 290 K.

Figure 5:
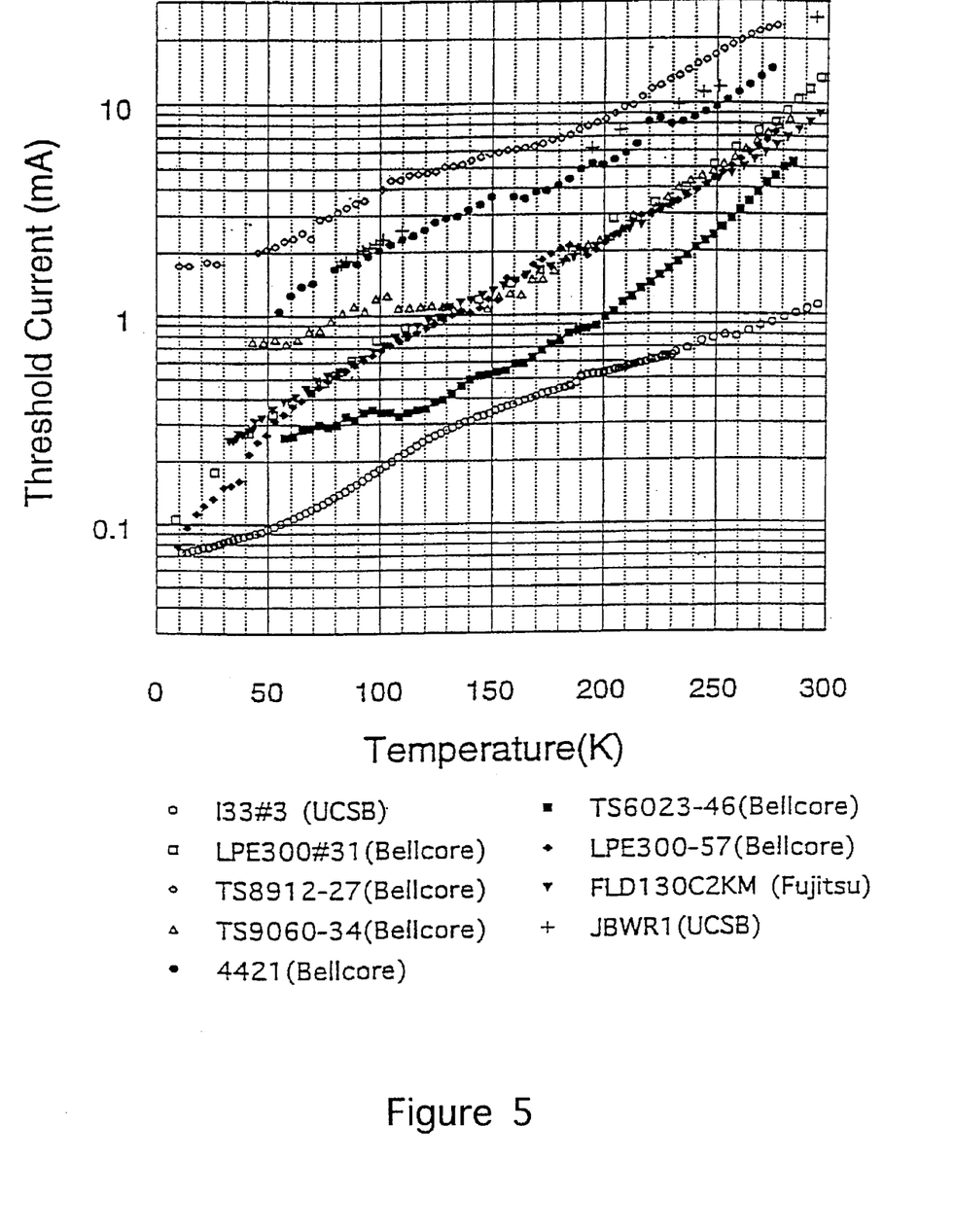
FIG. 5 depicts the threshold current as a function of temperature for nine laser diodes of varying design.

The threshold current as a function of temperature was determined for nine laser diodes. Table 1 lists the laser diodes tested. FIG. 5 shows a semilogarithmic plot of the threshold current as a function of temperature over the temperature range 5 K–300 K for the various diodes tested. In each case, the threshold current decreased with decreasing temperature.

TABLE 1

Test Laser Diodes for Threshold Current Determinations

| Laser Diode Designation | Type | Manufacturer |
|---|---|---|
| 133#3 | InGaAs, $\lambda = 980$ nm, Quantum Well | UCSB |
| LPE300#31 | InGaAsP, $\lambda = 1300$ nm, Bulk | Bellcore |
| TS8912-27 | InGaAsP, $\lambda = 1550$ nm, Quantum Well | Bellcore |
| TS9060-34 | InGaAsP, $\lambda = 1300$ nm, Quantum Well | Bellcore |
| 4421 | InGaAsP, $\lambda = 1300$ nm, Bulk | Bellcore |
| TS6023-46 | InGaAsP, $\lambda = 1550$ nm, Quantum Well | Bellcore |
| LPE300#57 | InGaAsP, $\lambda = 1300$ nm, Bulk | Bellcore |
| FLD130C2KM | InGaAsP, $\lambda = 1300$ nm, Bulk | Fujitsu |
| JBWR1 | InGaAsP, $\lambda = 1550$ nm, Quantum Well | UCSB |

Example 3. Modulation Bandwidth As a Function of Temperature.

Figure 6:
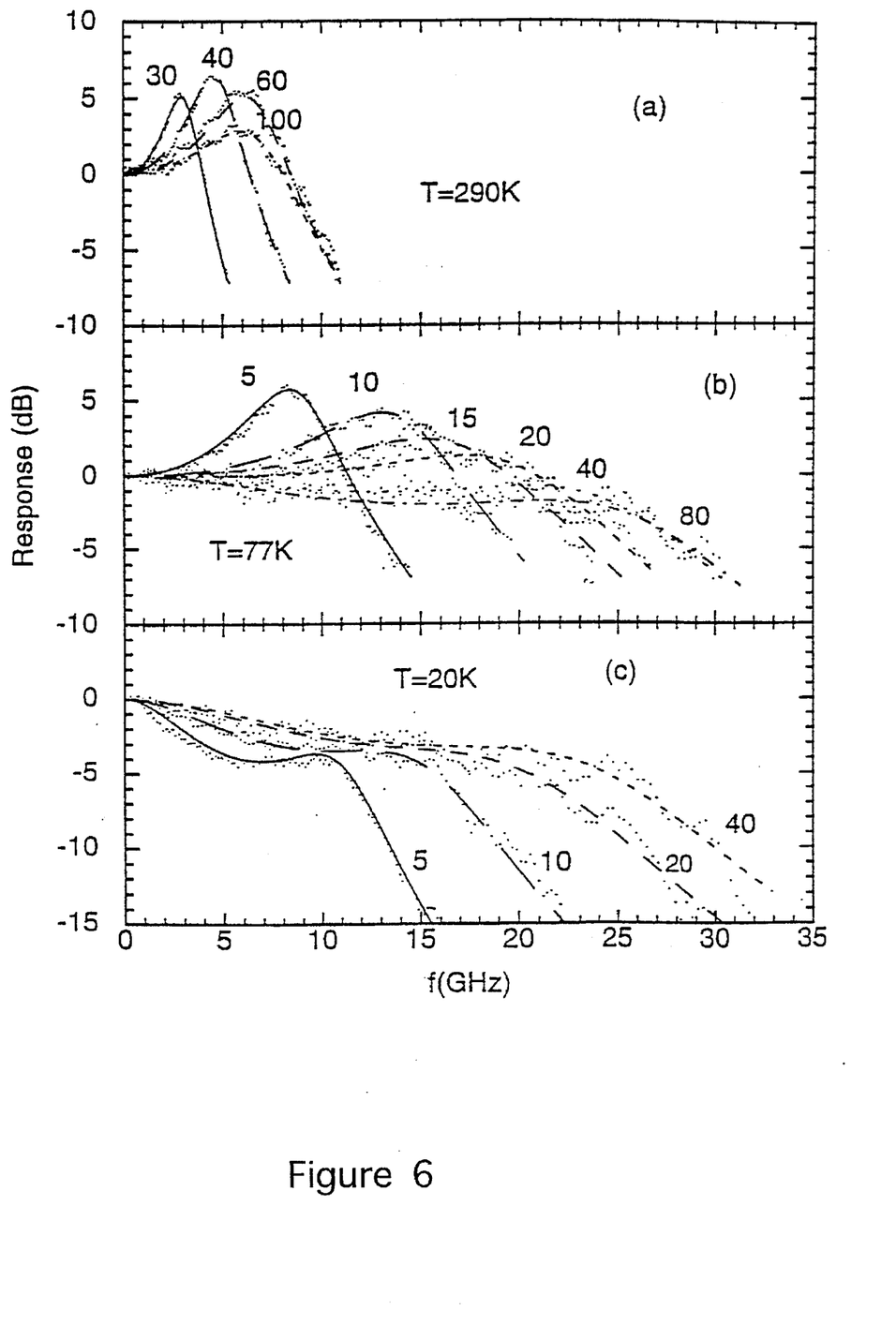
FIG. 6 shows the response of the laser diode at bias currents of 5 to 80 mA at 290 K, 77 K and 20 K.

The laser modulation bandwidth was determined by measurement of the transmission response of the optical link followed by derivation of the response of the laser diode by correcting against the frequency response of the photodetector. FIG. 6 shows the response of the laser diode of Example 1 at bias currents of 5 to 80 mA at 290 K, (FIG. 6(a)), 77 K (FIG. 6(b)) and 20 K (FIG. 6(c)), respectively. The bandwidth of the laser diode increased dramatically with the decrease in temperature from 290 K to 77 K. The maximum laser bandwidth exceeded 27 GHz at 77 K in comparison to the maximum bandwidth of less than 10 GHz at 290 K. With further cooling, the parasitic-like low frequency roll-off became significant, as can be seen clearly in the 20 K data (FIG. 6(c)).

Figure 7:
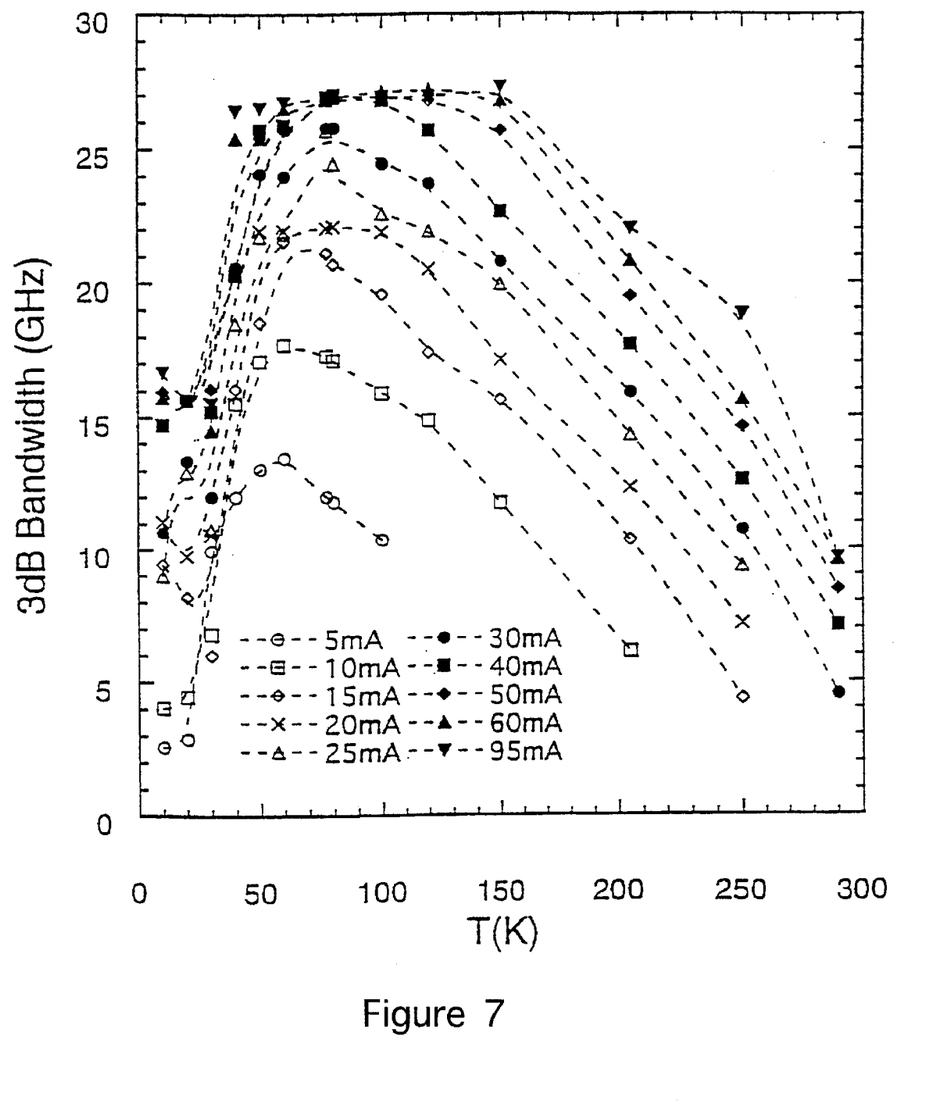
FIG. 7 shows the temperature dependence of the 3 dB modulation bandwidth of the laser diode at various bias currents.

FIG. 7 shows the temperature dependence of the 3 dB modulation bandwidth of the laser diode at various bias currents. From 300 K to 100 K, the modulation bandwidth increased nearly linearly with a slope of 65–100 MHz/K at net injected currents of 10 mA to 40 mA. However, at temperatures below 60 K, the bandwidth decreased rapidly. It can be seen from FIG. 7 that for the laser diode tested at a bias current of 40 mA the maximum modulation bandwidth was obtained at a temperature of approximately 80 K At lower bias currents, the maximum temperature decreased, with the maximum at about 60 K for a 5 mA input bias. It can further be seen from FIG. 7, that an increase in bias current to 80 mA afforded little or no improvement in the maximum modulation bandwidth. Increasing the bias current above that necessary to achieve maximum bandwidth may, however, be desirable in order to increase the modulation signal depth.

Example 4. 28 GHz Video Signal Carrier Transmission

The FCC is expected to allocate the 27–29 GHz airwave band for commercial applications. Exploitation of this new communications band requires the development of 28 GHz microwave radio transmission-receiving system for multihundred channel video/phone service delivery. Although transmission of the 28 GHz signals via satellite is one possible mode of utilization of this band, an alternative is a system utilizing optical fiber transmission lines combined with radio transmission for the "last-mile" delivery to the customers. An optical fiber backbone carrying 28 GHz carrier signals directly interfacing with these microwave transmitters will greatly simplify the system design and reduce overall cost, since many up and down converters would be eliminated. With the system of the invention, a carrier signal having a frequency less than or equal to the modulation bandwidth of the laser diode may be used without up and down conversion of the signal.

Figure 8:
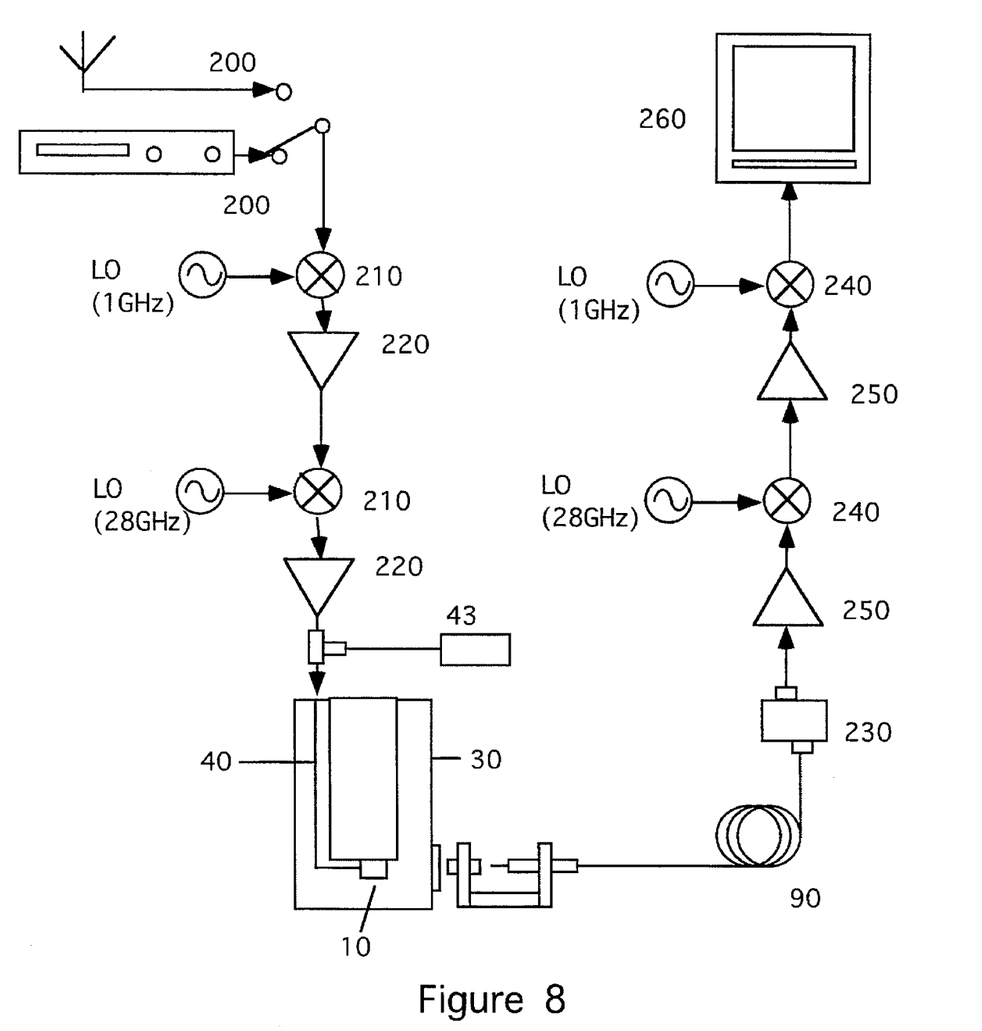
FIG. 8 depicts a system for delivering a video signal on a 28 GHz carrier over an optical fiber link.

FIG. 8 depicts a system for delivering a video signal on 28 GHz carrier using an optical fiber link [90] with a cooled laser diode [10] as the transmitter. A 4 quantum well InGaAsP laser diode [10], cryogenic dewar [30], input cable [40], lens [70] and optical fiber [90] were assembled as in Example 2. A video source signal [200] was up-converted into 27.7 GHz signal through two mixers [210] and amplifiers [220] to a modulation signal peak level of about −12 dbm and a signal to noise ratio (S/N) of about 60 dB. The signal was combined with a bias current [43] and delivered to the laser diode [10] through the input cable [40]. The laser diode temperature was at 100 K with less than 0.5 K fluctuation. The laser output was delivered to a photodetector [230] through an optical fiber cable [90]. The video signal was down-converted to the base band signal by two mixers [240] and amplifiers [250] and displayed on a television monitor. [260]. For a 30 meter regular single mode optical fiber, the recovered TV signal was near "broadcast" quality, marked by an S/N above 40 dB. The signal degraded when the fiber replaced by 250 meter dispersion shifted fiber, with S/N decreasing to about 30 dB. The degradation due to use of an FB laser, which was multimode with a wavelength distribution over 20 nm and a temperature shift in the lasing wavelength.

Example 5. Optical Short Pulse Generator

Figure 9:
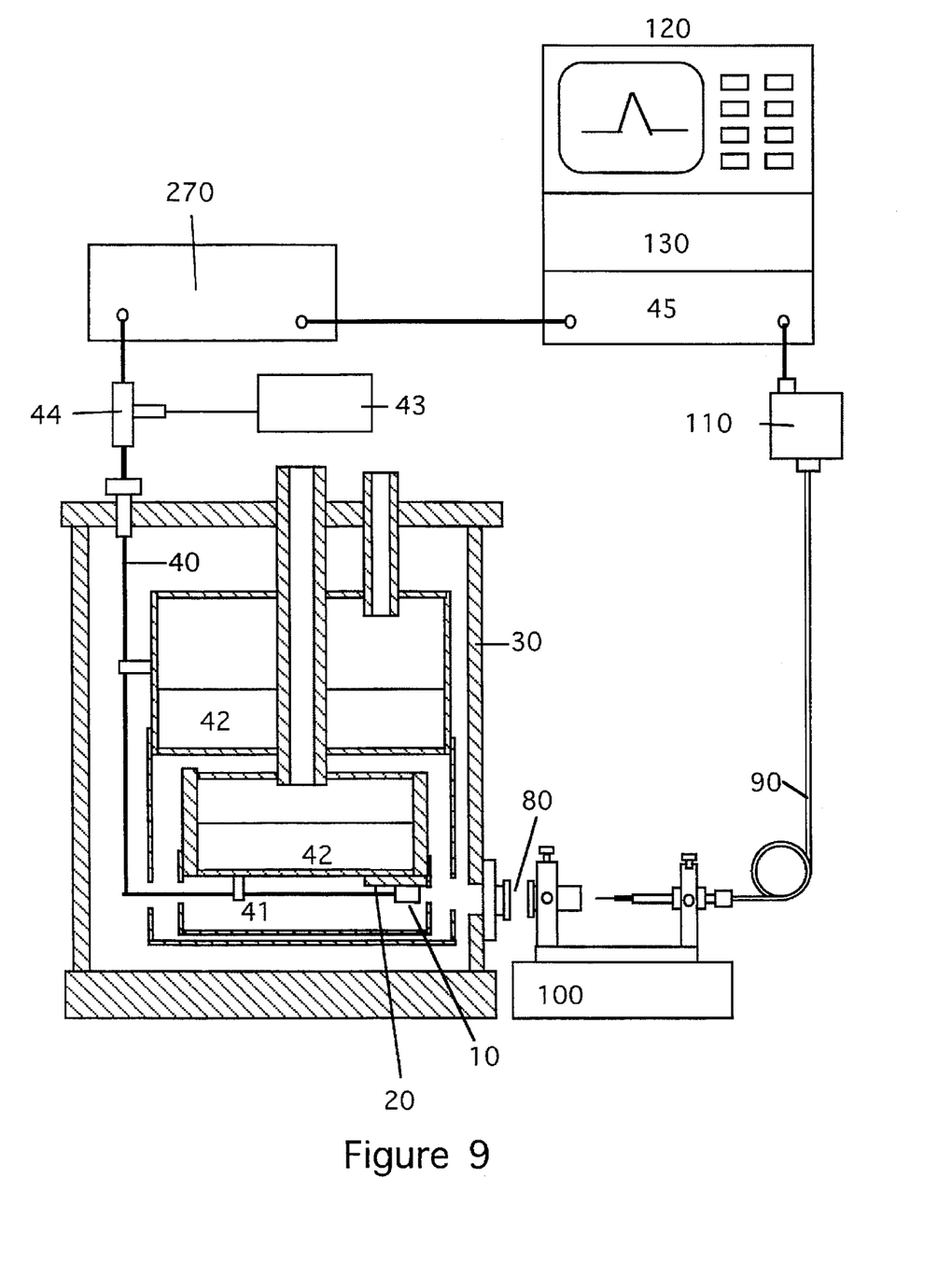
FIG. 9 depicts a system for use of the laser of the invention for optical pulse generation.
Figure 10:
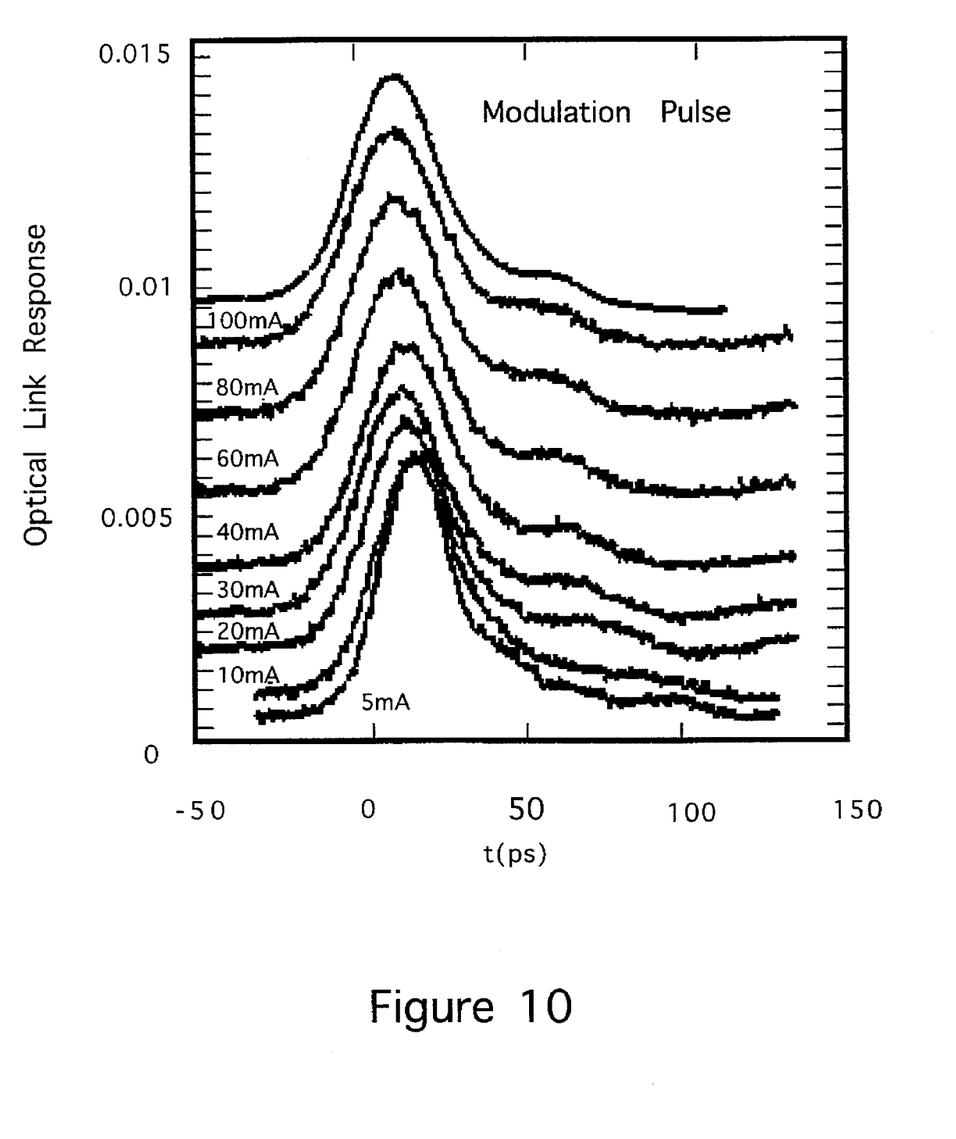
FIG. 10 depicts a modulation input pulse and response of a laser diode of the invention with an applied bias current below the threshold current.

An ultrahigh speed laser diode can be used for picosecond pulse generator. When bias current is slightly below its threshold level, and a short electrical pulse is applied, the resulting optical pulse exhibits a width significantly shorter than the applied electrical pulse. This is so called gain switching effect. FIG. 9 depicts the apparatus for use of the invention as a pulse generator. The test equipment of Example 1 was modified by using a pulse generator [280] to provide the modulation input. FIG. 10 shows the optical pulse [300] obtained from a single input electrical pulse [310]. The laser diode was cooled to 85 K, and was dc biased at 1 mA, which is below its threshold current of 1.6 mA. An electrical pulse of 33 ps full width at half maximum (FWHM) width was applied to the laser diode. An optical pulse of 17 ps FWHM was obtained.

Figure 11:
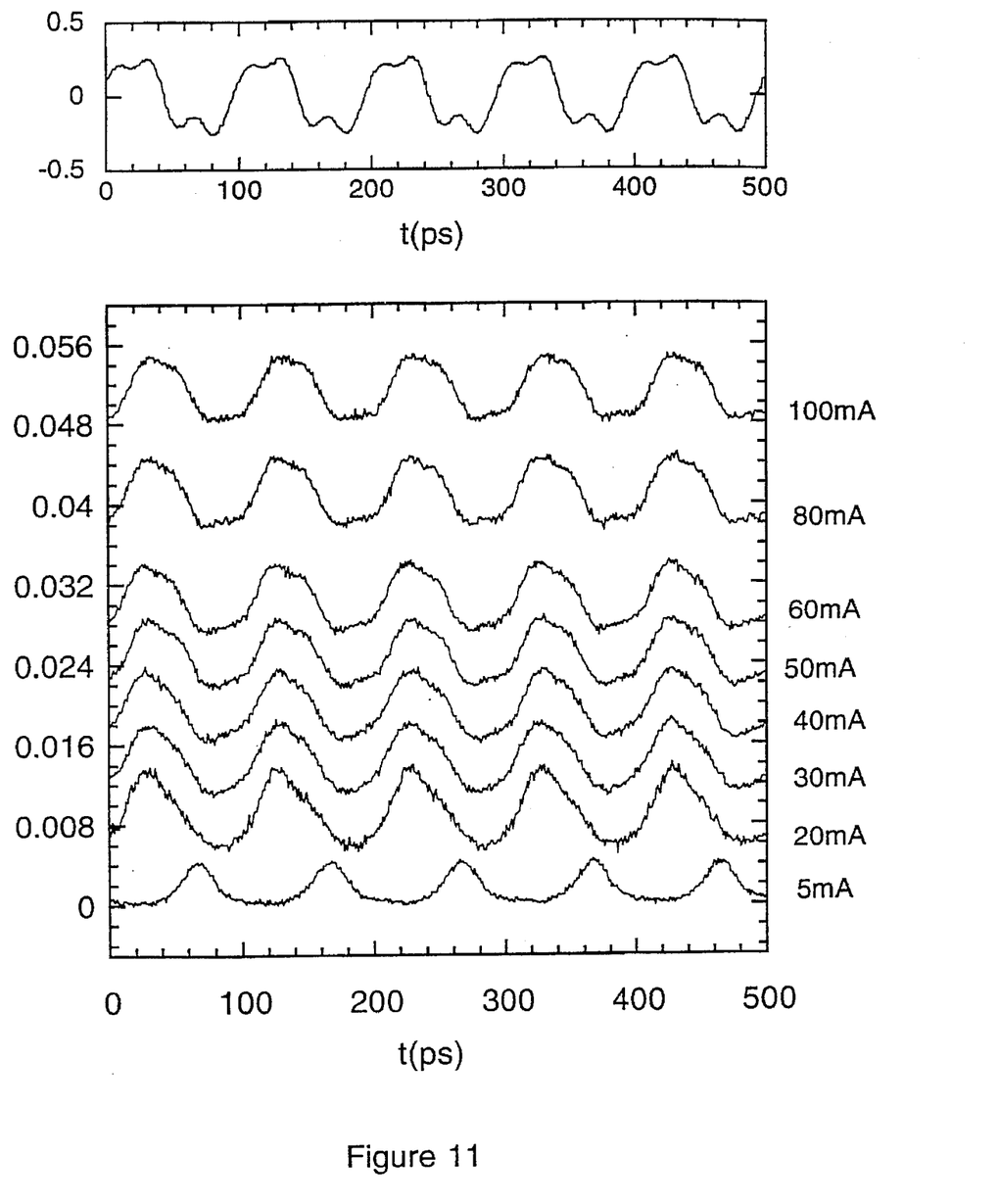
FIG. 11 depicts the response of the laser of the invention to a fast input electrical short pulse signal.

In a separate experiment, an electrical pulse with a desired shape was applied to the cryogenically cooled laser diode with a bias current above the threshold current of the laser diode. The optical output mimicked the input electrical pulse shape. It may be seen from FIG. 11 that the laser diode optical pulse resembles the fast input electrical pulse when bias is at a sufficiently high level.

Example 6. Optical Fiber Delay Line

An ultrahigh speed laser diode can be used for long delay line for millimeter wave applications. The huge bandwidth of the optical fiber of the invention allows an optical signal modulated with millimeter wave frequency to travel without much of loss. If the laser diode wavelength is selected at the zero (or minimal) dispersion point and low attenuation point (e.g. 1300 nm on a regular single mode fiber or 1550 nm on a dispersion shifted fiber), and the wavelength distribution is minimized, one can achieve a very long delay time for very high frequency signal.

In one experiment, a 28 GHz microwave signal was applied to modulate a laser diode, which was kept at 101 K and 30 mA bias current. The output light was coupled to an 250 meter dispersion shifted fiber, and recovered by a 45 GHz photodetector. The 28 GHz signal was recovered with about a 10 dB loss. The signal required 1.2 microseconds to travel the length of a 250 meter fiber. The 10 dB loss was partly due to the bandwidth limit of the laser diode (3–4 dB), partly due to dispersion loss, since the lasing wavelength was not at 1550 nm at 100 K, and partly due to the broad wavelength distribution of the Fabry-Perot laser. In the preferred embodiment, the laser has a lasing wavelength of 1300 nm or 1550 nm at 100 K and a distribution feedback structure. The fiber length is selected to yield the desired delay time for dispersion shifted fiber.

CONCLUSION, RAMIFICATIONS AND SCOPE

Although it was previously known that temperature affected the performance of semiconductor laser diodes, it has not previously been recognized that the modulation bandwidth of a laser diode could be maximized by selection of the bias current and temperature of operation. Numerous investigators have attempted to achieve ultrahigh speed lasers. Previously, ultrahigh speed transmission, in the 25 GHz range, was only achieved by careful selection of laser diode design combined by aggressive driving of the lasers at bias currents approaching 200 mA. High bias currents are disadvantageous, however, because they lead to excessive heating, and early burnout of the laser, and can result in signal distortion.

The current invention offers a simpler, more readily achievable, approach to ultrahigh speed laser diode operation. The invention has been demonstrated using a laser having good, but not exceptional, performance at room temperature. Laser diodes having superior speed at room temperature should exhibit even greater speed at cryogenic temperatures than is reported in the examples given. We have provided a method of determining the optimum temperature and bias current for any suitable laser. The optimum combination is not necessarily that which give the highest modulation bandwidth. As bias current increases, the incremental increase in the modulation bandwidth decreases. Thus, it may be desirable to select a lower bias current, and select the temperature having the maximum bandwidth at that current. This is especially true for optical short pulse generators, where a bias current near the threshold current is selected, and the temperature selected accordingly. Where, however, a large modulation depth is desired, the laser may be operated at a high bias current without risk of burnout due to overheating.

While the above description contains many specific details, these should not be construed as limitations on the scope of the invention, but rather as an exemplification of preferred embodiments. Many other variations are possible and will no doubt occur to others upon reading and understanding the preceding description. Accordingly, the scope of the invention should be determined not by the embodiments illustrated, but by the appended claims and their legal equivalents.

We claim:

1. An ultrahigh speed laser system comprising:
   (a) a semiconductor laser diode;
   (b) a means for cooling the laser diode;
   (c) a means for providing bias current to the laser diode;
   (d) a means for providing a modulation current to the laser diode, the modulation current comprising an electrical signal having a frequency greater than 15 GHz; and
   (e) an output means for receiving optical output from the laser diode, whereby an increased modulation bandwidth of the laser is obtained by providing the bias and modulation currents to the laser while maintaining the laser below about 120 K such that an ultra high-speed laser system is achieved.

2. The system of claim 1 wherein the cooling means comprises a cold plate in contact with the laser diode.

3. The system of claim 2, further comprising a thermostat connected to the cold plate.

4. The system of claim 1 wherein the laser diode is selected from the group consisting of bulk, quantum well, strained multiple quantum well, Fabry-Perot and distributed feedback laser diodes.

5. The system of claim 1 wherein the output means comprises an optical fiber having a first end and a second end, wherein the first end is coupled to the laser diode and the second end is coupled to a photodetector.

6. The system of claim 1 wherein the modulation current means includes a pulse generator.

7. The system of claim 1, wherein the output means is an optical fiber having two ends, the first end being optically coupled to the laser diode and the second end being optically coupled to a photodetector.

8. A method of using a laser diode at high speed comprising:
   (a) maintaining the laser at a temperature of less than 120 K;
   (b) determining a threshold current of the laser at the temperature;
   (c) providing a DC bias current of less than the threshold current to the laser;
   (d) providing a modulation current to the laser; and
   (e) receiving an optical output from the laser responsive to the combined bias and modulation currents, whereby high speed operation of the laser system is achieved.

9. The method of claim 8 wherein the cooling is to a temperature of between 80 and 100 K.

10. The method of claim 8 wherein the modulation current comprises a signal with a carrier frequency of between 0.5 and 40 GHz.

11. The method of claim 8 wherein the modulation current comprises a signal with a carrier frequency of between 8 and 29 GHz.

12. The method of claim 8 wherein the bias current is slightly less than the threshold current and the modulation current is provided by a pulse generator.

13. The method of claim 8 wherein the receiving is by means of an optical fiber coupled to the light output.

14. The method of claim 13 further comprising the step of coupling a photodetector to the optical fiber whereby the light output of the laser is converted to an electrical signal.

15. The method of claim 14, wherein the optical fiber has a length selected to provide a desired delay of the signal.

* * * * *